US008226259B2

United States Patent
Van Pieterson et al.

(10) Patent No.: US 8,226,259 B2
(45) Date of Patent: Jul. 24, 2012

(54) TEXTILE LIGHT EMITTING DEVICE

(75) Inventors: Liesbeth Van Pieterson, Eindhoven (NL); Jan Cornelis Kriege, Eindhoven (NL); Hugo Johan Cornelissen, Eindhoven (NL); Rabin Bhattacharya, Eindhoven (NL); Maarten Marinus Johannes Wilhelmus Van Herpen, Eindhoven (NL); Bart Andre Salters, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 377 days.

(21) Appl. No.: 12/595,061

(22) PCT Filed: Apr. 14, 2008

(86) PCT No.: PCT/IB2008/051420
§ 371 (c)(1),
(2), (4) Date: Oct. 8, 2009

(87) PCT Pub. No.: WO2008/126053
PCT Pub. Date: Oct. 23, 2008

(65) Prior Publication Data
US 2010/0061101 A1 Mar. 11, 2010

(30) Foreign Application Priority Data
Apr. 17, 2007 (EP) .................................. 07106313

(51) Int. Cl.
*G02B 6/00* (2006.01)
(52) U.S. Cl. .......... 362/103; 362/572; 362/602; 362/606
(58) Field of Classification Search .................. 362/570, 362/572, 1, 2, 602, 606, 103
See application file for complete search history.

(56) References Cited

U.S. PATENT DOCUMENTS
4,907,132 A * 3/1990 Parker ........................... 362/556
(Continued)

FOREIGN PATENT DOCUMENTS
JP 2004308050 11/2004
(Continued)

OTHER PUBLICATIONS
Gould: "Textiles Gain Intelligence"; Materials Today, Elsevier Publishing, Oct. 2003, pp. 38-43.
Lehn et al: "e-TAGs: e-Textile Attached Gadgets"; Bradley Department of Electrical and Computer Engineering, Virginia Polytechnic Institute and State University, 2004,12 page document.
(Continued)

*Primary Examiner* — Anabel Ton
(74) *Attorney, Agent, or Firm* — Mark L. Beloborodov

(57) ABSTRACT

The invention relates to a light emitting device comprising a light emitting element (100) and a light guide (101) arranged on a textile substrate (102). The light guide has a back surface (103) facing the textile substrate, a front surface (104) facing away from the substrate, and a light receiving surface (105). The light emitting element (100) is arranged such that at least part of the light emitted by the light emitting element (100) is coupled into the light guide (101) through the light receiving surface (105), and is subject to total internal reflection in the light guide (101). Furthermore, the light guide (101) is arranged such that at least part of the light coupled into the light guide (101) exits the light guide (101) through the front surface (104) and/or the back surface (103). By arranging a light guide in conjunction with a light emitting element, the emitted light is distributed within the light guide and exits the light guide from an area that is larger than that of the light emitting element. Hence, a larger portion of the textile substrate can be made luminous without the need for using a more dense pattern of light emitting elements.

14 Claims, 1 Drawing Sheet

U.S. PATENT DOCUMENTS

| | | | | |
|---|---|---|---|---|
| 5,882,110 | A | * | 3/1999 | Rapisarda ..................... 362/570 |
| 6,091,874 | A | | 7/2000 | Higashi et al. |
| 6,092,906 | A | * | 7/2000 | Olmstead ...................... 362/105 |
| 6,443,978 | B1 | * | 9/2002 | Zharov ............................ 607/91 |
| 6,974,224 | B2 | * | 12/2005 | Thomas-Benedict ......... 362/103 |
| 8,021,148 | B2 | * | 9/2011 | Goodson et al. ................ 433/29 |
| 2002/0043012 | A1 | | 4/2002 | Shibata et al. |
| 2004/0190307 | A1 | | 9/2004 | Kitamura et al. |
| 2006/0257095 | A1 | | 11/2006 | Walt et al. |
| 2007/0013663 | A1 | | 1/2007 | Park |

FOREIGN PATENT DOCUMENTS

| | | |
|---|---|---|
| WO | 03094719 A1 | 11/2003 |
| WO | 2004109380 A1 | 12/2004 |
| WO | 2006137623 A1 | 12/2006 |

OTHER PUBLICATIONS

Harlin et al. "Development of Polymeric Optical Fibre Fabrics as Illumination Elements and Textile Displays"; Autex Research Journal, vol. 3, No. 1, Mar. 2003, 1-8.

* cited by examiner

TEXTILE LIGHT EMITTING DEVICE

FIELD OF THE INVENTION

The present invention relates to a light emitting device comprising a light emitting element and a light guide arranged on a textile substrate. The invention also relates to a method for manufacturing the light emitting device, and to a light emitting device for use in photonic therapy.

BACKGROUND OF THE INVENTION

In recent years, many efforts have been made to change passive textiles into intelligent and interactive systems by the integration of electronics. For example, efforts have been made to provide textiles with light emitting element, such as light emitting diodes in order to turn such textiles into textile integrated display devices.

There are many possible applications for textile integrated display devices. One example of such a textile integrated display device is described in the Japanese patent publication 2004-308050, describing a garment with light emitting diodes attached to it in a predetermined pattern.

However, light emitting diodes are point source emitters, so a textile with light emitting diodes attached to it at certain spacing has no appealing look. Further, for many applications, such as wearable textile products for light-therapy uses, it may be important that the light emitted is more or less homogenously distributed over the textile area.

Hence, there is a need in the art for a textile based light emitting device from which light may be emitted from a larger area portion, without affecting the textile feel and flexibility of the device.

SUMMARY OF THE INVENTION

It is an object of the present invention to provide a textile based light emitting device from which light may be emitted from a larger area portion, without affecting the textile feel and flexibility of the device.

In a first aspect, the present invention relates to a light emitting device comprising a light emitting element and a light guide arranged on a textile substrate, the light guide having a back surface facing the textile substrate, a front surface facing away from the textile substrate, and a light receiving surface, the light emitting element being arranged such that at least part of the light emitted by the light emitting element is coupled into the light guide through the light receiving surface, and is subject to total internal reflection in the light guide, and the light guide being arranged such that at least part of the light coupled into the light guide exits the light guide through at least one of the front surface and the back surface.

By arranging a light guide in conjunction with a light emitting element, the emitted light is distributed within the light guide and exits the light guide from an area that is larger than that of the light emitting element. Hence, a larger portion of the textile substrate can be made luminous without the need for using a more dense pattern of light emitting elements. Moreover, this solution for spreading the light is very thin.

The light guide used in the present invention may have a two-dimensional extension in the plane of the textile substrate so that the light from the light emitting element is distributed over a larger area portion of the textile substrate area, contrary to an essentially one-dimensional light guide, such as an optical fiber.

In embodiments of the present invention, the textile substrate may comprise reflective material.

Light in the light guide that is extracted therefrom through the back surface will be partly reflected and scattered by the reflective material. This will result in a diffuse light bundle that is reflected back towards the light guide and that will leave the light guide through the front surface thereof.

In embodiments of the present invention, the light guide may be bonded to the textile substrate by means of a transmissive bonding material.

Such a bonding material physically secures the light guide to the textile substrate and allows light to exit the light guide through the back surface of the light guide.

Preferably, the refractive index of the bonding material is higher than the refractive index of the surrounding atmosphere and lower that the refractive index of the light guide material.

The bonding material typically has a refractive index higher than the surrounding atmosphere (often air, having a refractive index of ~1). Consequently, light will more preferentially be extracted from the back surface of the light guide than from the front surface. This is especially advantageous in conjunction with a reflective textile, or a reflective material arranged between the light guide and the textile, since a higher portion of the light will be reflected and scattered in the textile. Furthermore, the refractive index of the bonding material is preferably lower that the refractive index of the light guide, which ensures radiation transport by means of total internal reflection towards the end of the light guide and hence better spreading of the light.

In embodiments of the present invention, the light guide may comprise a flexible material.

When the light guide comprises a flexible material, it may be attached to the textile substrate without essentially affecting the flexibility of the device.

In embodiments of the present invention, the light emitting element may be optically bonded to the light receiving surface of the light guide.

When the light emitting element is optically bonded to the light receiving surface, a higher portion of the light emitted by the light emitting element will be coupled into the light guide, hence increasing the light output from the light guide.

In embodiments of the present invention, the light emitting element may be incorporated in the light guide.

When the light emitting element is incorporated in the light guide, it is protected from mechanical influences. Further, this also means that the light receiving surface of the light guide is located within the light guide.

In embodiments of the present invention, a reflective material may be arranged between the light guide and the textile substrate.

A reflective material may be arranged between the light guide and the textile substrate to increase the reflection of light extracted through the back surface towards the front surface of the light guide. This may be used to increase the yield of light that is visible to a viewer of the device.

In embodiments of the present invention, the thickness of the light guide decreases with distance from the light receiving surface.

A light guide with a tapered or wedged shape will lead to a gradual extraction of light through the front and the back surfaces of the light guide since the angle of incidence on the surfaces gradually will increase with the number of reflections in the light guide. Hence, this shape is a very simple shape for obtaining the desired distribution and extraction of light.

In embodiments of the present invention the light guide comprises a light extracting structure for extracting light, subject to total internal reflection in the light guide, from the light guide via at least one of the back surface and the front surface.

Also other light guide shapes than tapered or wedge-shaped light guides are possible to use in the present invention.

In a second aspect, the present invention also relates to a method for the manufacture of a light emitting device according to the present invention, comprising arranging a light guide and a light emitting element on a textile substrate, and cutting the sides of the light guide into a predetermined shape.

In a third aspect, the present invention relates to the use of a light emitting device of the present invention in photonic therapy.

BRIEF DESCRIPTION OF THE DRAWINGS

These and other aspects of the present invention will now be described in more detail, with reference to the appended drawings showing a currently preferred embodiment of the invention.

DETAILED DESCRIPTION

The present invention relates to a light emitting device comprising a light emitting element and a light guide arranged on a textile substrate, wherein the light guide has a back surface facing the textile substrate, a front surface facing away from the textile substrate, and a light receiving surface. The light emitting element is arranged such that at least part of the light emitted by the light emitting element is coupled into the light guide through the light receiving surface, and is subject to total internal reflection in the light guide. The light guide is arranged such that at least part of the light coupled into the light guide can exit the light guide through at least one of the front surface and the back surface of the light guide.

As used herein, the term light emitting element refers to any type of light emitting element known to those skilled in the art and includes, for example, light emitting diodes (LEDs) such as inorganic LEDs and organic LEDs. Light emitting elements emitting light of any color, from UV to IR, are contemplated in the present invention.

The light emitting elements are connected to and driven by electrically conductive lines, typically integrated in the textile substrate, such as arranged on, under or within the textile substrate.

Figure 1:
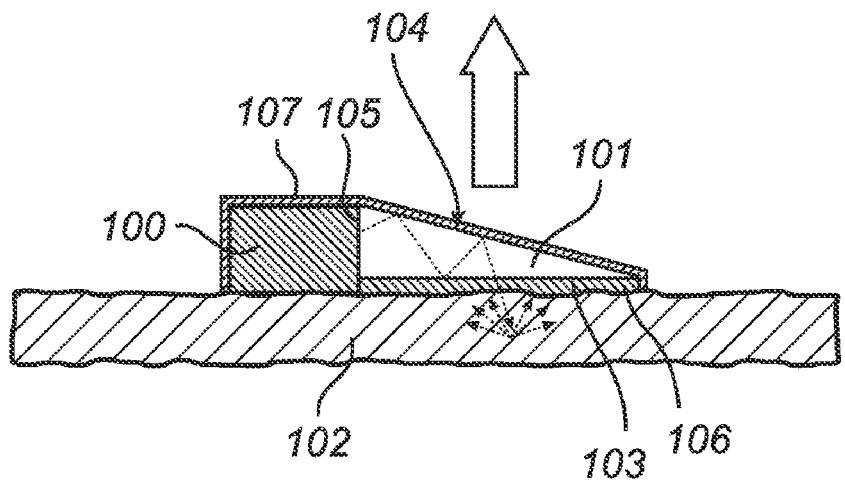
FIG. 1 illustrates in cross-sectional view a detail of a first embodiment of a light emitting device according to the present invention.

FIG. 1 illustrates a first embodiment of a light emitting device according to the present invention, comprising the light emitting diode 100 and the light guide 101, that are both arranged on the textile substrate 102.

The light guide 101 comprises a transparent material and has the shape of a tapered plate. The light guide 101 has a back surface 103 facing the textile substrate 102 and a front surface 104 facing away from the textile substrate 102. The light guide 101 further has a light receiving surface 105 at the thicker end of the tapered plate. Hence, the thickness of the light guide 101 (being the vertical distance between the front surface 104 and the back surface 103) decreases with distance from the light receiving surface 105.

The light guide 101 is bonded to the textile substrate 102 by means of the transmissive bonding material 106, such as glue. The transmissive bonding material 106 connects the light guide 101 to the textile substrate 102, both optically and physically.

With respect to the light guide 101, a light emitting diode 100 is arranged to emit light into the light guide via the receiving surface 105.

The textile substrate 102 is reflective, such that light that falls into the textile is reflected by the fibers that make up the textile, or by reflective elements such as reflective and/or scattering particles that are present in the textile. The textile substrate 102 may for example be a woven, a non-woven or a knitted textile or mixtures thereof. The textile may comprise natural or synthetic fibers or mixtures thereof. For the purpose of being reflective, the textile is preferably white or light colored.

The light guide 101 has the shape of a (truncated) wedge, having an essentially planar back surface 103 that faces the textile substrate 102, and an opposing front surface 104 that faces away from the textile substrate 102. The back surface 103 and the front surface 104 of the light guide 101 are connected by lateral surfaces, and one of these lateral surfaces serves as the light receiving surface 105. The light receiving surface 105 is at the thickest side of the wedge-shaped light guide 105. Hence, the thickness of the light guide 101 decreases with distance from the light receiving surface 105.

It is desired that the width and the height of the light receiving surface 105 is at least the width and the height, respectively, of the light emitting diode 100, such that the amount of light emitted by the light emitting diode 100 that is received by the receiving surface 105 is as large as possible.

It is preferred that the light guide 101 has a two-dimensional extension in the plane of the textile substrate 102, so that the light from the light emitting diode 100 is distributed over a two-dimensional surface area.

Light which is coupled into the light guide 101 will, depending on its direction, encounter one of the front surface 104 and the back surface 103. If, at the first encounter, the light has an angle of incidence that exceeds the critical angle for total internal reflection, it will be reflected internally towards the other one of the front surface 104 and the back surface 103. Due to the angle between the front surface 104 and the back surface 103, the angle of incidence will gradually decrease with the numbers of internal reflections, until it finally falls below the critical angle for total internal reflection. At this point, light will be extracted from the light guide 101. This gradual extraction of light serves to distribute the light within the light guide 101, such that light is substantially homogeneously extracted from the entire light guide 101.

However, the angular distribution of light exiting a light guide after such a gradual decrease of the angle of incidence is shifted away from the normal of the extraction surface (such as the front surface 104). Hence, this light will have its mean component at a rather large angle from the normal of the surface. In many cases, it is desired to obtain light extraction where the mean component is closer to the normal of the substrate surface. Hence, it is preferred to use a textile substrate 102 that is reflective.

Light that is extracted out of the light guide 101 via the back surface 103 will be extracted into the textile substrate 102. As the textile substrate 102 in this embodiment comprises a reflective material, such as white, reflective fibers, the light will be scattered and reflected back towards the light guide 101 and out in a forward direction towards a viewer of the light guide 101 facing the front surface 104. Due to the scattering action of the reflective textile material, this light will be very diffused.

The light guide 101 comprises an optically clear material, such as glass, ceramics, plastics, for example polymethylmethacrylate (PMMA), or elastomerics, such as polysiloxanes (for example PDMS (polydimethylsiloxane)). One example of a PDMS-material suitable for use as elastomeric light guide material is PDMS wherein a portion of the methyl groups are substituted by phenyl groups, which leads to an increased refractive index.

An elastomeric light guide may be preferred when it comes to providing a light guide having high flexibility.

The back surface 103 and the front surface 104 of the light guide 101 may be flat or may be structured, wherein a structured surface may give a higher degree of diffusion of the light.

In the embodiment shown in FIG. 1, the light guide 101 is bonded to the textile substrate 102 by means of a transmissive bonding material 106, such as a transparent glue. Preferably, the bonding material 106 has a refractive index that is essentially higher than 1. Preferably, the bonding material 106 further has a refractive index that is essentially below the refractive index of the light guide material. With such a bonding material, total internal reflection is obtainable within the light guide 101 and at least a fraction of the light coupled into the light guide 101 is transported towards the end of the light guide 101 by total internal reflection on the interface of the light guide 101 and the bonding material 106. This contributes to a better spreading of light in the light guide 101. A further effect of such a bonding material 106 is that the critical angle for total internal reflection is higher at the interface between the light guide 101 and the bonding material 106 than at the interface between the light guide 101 and air (due to the smaller, but still existing, difference between the refractive indices of the light guide material and the bonding material, as compared with the difference between the refractive indices of the light guide material and air). Hence, light will more easily be extracted out of the light guide 101 via the back surface 103 than via the front surface 104. Hence, a larger portion will be extracted into the reflective textile substrate 102 and thereafter, in a diffuse manner, be reflected back towards a user viewing the light guide side of the device.

Additionally, the bonding material 106 serves to physically secure the light guide 101 to the textile substrate 102.

Examples of suitable bonding materials are known to the skilled person, and include for example epoxy based bonding materials and siloxane based bonding material, such as for example PDMS. When the light guide material is a flexible material, a flexible bonding material is preferred.

Figure 2:
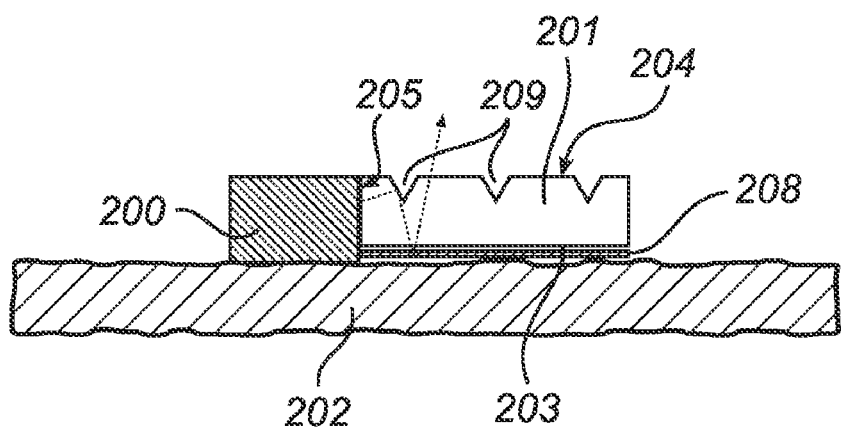
FIG. 2 illustrates in cross-sectional view a detail of a second embodiment of a light emitting device according to the present invention.

In FIG. 2, a second embodiment of a light emitting device according to the invention is illustrated, wherein the reflective material 208 is arranged between the light guide 201 and the textile substrate 202, with a reflective surface facing the back surface 203 of the light guide 201. This arrangement may for example be used when the textile substrate 202 has poor reflective properties (e.g. a black textile material). The reflective material may be bonded to the back surface 203 of the light guide 201 by means of a transmissive bonding material, as is described above, and the reflective material may further be bonded to the textile substrate 202 by means of a bonding material. The reflective material 208 may comprise a smooth or structured reflective surface, where a structured reflective surface may yield a higher degree of diffusion of the light. Preferably, the reflective material 208 has a structured reflective surface facing the light guide 201.

FIG. 2 also illustrates another embodiment of a light guide that may be used in the present invention. It is to be noted that the light guide 101 of FIG. 1 and the light guide 201 of FIG. 2 may be interchanged.

The light guide 201 is an essentially flat plate with small grooves 209 arranged in the front surface 204. The grooves 209 are light extracting structures that disturb the light propagation in the light guide 201 such that light is extracted from the light guide 201.

The present invention is not limited to the two structures for light guides that are proposed in the description above. Instead, many structures, from which light is extracted both through the back surface and through the front surface, are contemplated for use in the present invention. For example, variants of the light guide 201 of FIG. 2 with grooves in the back surface 203 instead of, or in addition to, the grooves 209 in the front surface 204 will also work. Light extracting structures may also be in the form of reflective surfaces molded into the light guide 201.

A diffusive layer, such as a non-woven layer or a foam may also be provided at a light exiting surface of the light guide, being either the front surface, the back surface, or both. When the light emitting device comprises a plurality of light emitting elements and light guides, the light guides are preferably arranged to be in contact and to form a light guiding grid, and the diffusive layer is applied as a continuous layer. The openings of the grid preferably have a size that is chosen such that the diffusive layer is able to make the emission of light by the light emitting device appear homogeneously. For example, the openings in the light guiding grid are squares with sides that are smaller than 10 mm, preferably smaller than 5 mm.

In the embodiments illustrated in FIGS. 1 and 2, the light emitting diodes 100 and 200 are located in close proximity to the light receiving surface 105 and 205, respectively, and they are arranged to emit light towards the light receiving surfaces 105 and 205 of the light guides 101 and 201, respectively.

A light emitting element may further be physically and optically bonded to a light receiving surface of a light guide, for example by using an optically transmissive glue between the light emitting element and the light receiving surface. As shown in FIG. 1, it is also possible to incorporate the light emitting diode 100 and the light guide 101 in the transparent encapsulation 107, such as an elastomeric encapsulation, in order to firmly attach the light emitting diode 100 to the light guide 101, and to protect them from mechanical impact. In yet another alternative, a light emitting element may be embedded within a light guide, for example by molding the light emitting element into the light guide material. This has the consequence that the light receiving surface is located within the light guide.

One example of an in-molded light emitting element is a wedge-shaped light guide of phenyl substituted PDMS with an LED molded into the thick end of the wedge-shaped light guide and arranged to emit light towards the thin end of the wedge-shaped light guide. Such an assembly may be embossed on the textile, for example on a textile substrate pretreated with unsubstituted PDMS having a refractive index lower than that of the substituted PDMS.

When a light emitting element is optically bonded to a light guide, light with a very large angular spread can be coupled into the light guide. In order to subject a larger portion of the light to total internal reflection in the light guide, the light may need to be collimated. Hence, a light emitting device according to the invention may also comprise a collimator to collimate at least part of the light emitted by the light emitting element, either before or after it has been coupled into the light guide. Furthermore, a light emitting device according to the invention may also comprise a collector to collect at least part of the light emitted by the light emitting element, and/or a projector to project at least part of the light emitted by the light emitting element onto a target, such as the light receiving surface of a light guide, or the reflective surface of a textile substrate.

With respect to the light emitting device according to the invention, a light emitting element, a collimator, a collector, a projector, and a light guide may be provided as separate components, or as one or more integrated components. For example, a collector may be integrated with a light emitting element in a package. In turn, such a package may be embedded within a light guide.

Prior to or after having arranged a light emitting element and a light guide on a textile substrate, the light guide can be cut into a desired shape. For example, the light guide can be mass-produced in a certain shape, such as for example a square, and then cut into the desired shape. The cutting may for example be achieved by means of laser cutting. In preferred embodiments, the light guide can be shaped in situ after having arranged the light guide on the textile substrate.

In addition to the shapes as shown in FIGS. 1 and 2, for the purpose of the invention a light guide may also have a shape that encloses a light emitting element. For example, the light guide may be a light guiding ring that is arranged on a textile substrate, with the light emitting element being positioned at the centre of the ring so as to be able to emit at least part of the light into the light guiding ring (note that in this situation the light guide has a cylindrical light receiving surface). Preferably, the light guiding ring has a thickness of about 1 millimeter or less, and a diameter of 10 millimeters or less, so that the light emitting device, particularly when it is a wearable garment, can still be folded and wrapped. Of course, for larger devices more appropriate dimensions may be chosen.

An assembly comprising a light emitting element and a light guide may for example be attached to a substrate by a bonding material between the back surface of the light guide and the substrate, as described above, or by attaching, for example by soldering or clamping, the light emitting element to conductive lines of the substrate.

The dimension of a light guide suitable for use in the present invention depends on, for example, the type of textile substrate and the application. However, in typical cases, the length and width of a light guide is in the order of a few millimeters to a few centimeters, such as from about 1 millimeter to about 10 centimeter, and the height of the light guide is about 0.1 millimeter to about 1 centimeter.

For a wedge-shaped light guide, the angle between the front surface and the back surface is typically in the range of about 1 degree to about 10 degrees.

The person skilled in the art realizes that the present invention is by no means limited to the preferred embodiments described above. On the contrary, many modifications and variations are possible within the scope of the appended claims. For example, more than one light emitting element, such as two, three or more, may be arranged to emit light into a single light guide. For example, an array of three LEDs (e.g. one red, one green and one blue) arranged side-by-side may be arranged to emit light into one light guide in order to form a color variable LED-light guide assembly. Two LEDs may be arranged back-to-back with one light guide on each side of the pair of LEDs. Further, two light guides may be arranged to receive the light from a single LED, such as for example light from a so-called "bat-wing" LED that emits light in two opposite directions.

Light emitting devices of the present invention may be used in any application where it is desired to obtain light emission from a textile substrate. Examples of such applications include, but are not limited to, dynamic lighting, such as furniture upholstery, curtains, carpets, wearable garments and accessories with integrated displays, such as bags and backpacks, textile articles for photonic therapy, such as wearable garments for acne treatment, wound healing, pain relief, baby jaundice, etc. For example, a human or non-human animal patient in need of photonic therapy may wear a garment that accommodates a light emitting device of the present invention, with the light guides facing the skin of the patient. In operation, when the light emitting elements of the device emit light, the patient is subjected to the photonic therapy.

The invention claimed is:

1. A light emitting device comprising a light emitting element and a light guide arranged on a textile substrate, the light guide having a back surface facing the textile substrate, a front surface facing away from the textile substrate, and a light receiving surface, the light emitting element being arranged such that at least part of the light emitted by the light emitting element is coupled into the light guide through the light receiving surface, and is subject to total internal reflection in the light guide, and the light guide being arranged such that at least part of the light coupled into the light guide exits the light guide through at least one of the front surface and the back surface, wherein the light emitting element is optically bonded to the light receiving surface.

2. A light emitting device according to claim 1, wherein the light guide has a two-dimensional extension in the plane of the textile substrate.

3. A light emitting device according to claim 1, wherein the textile substrate comprises a reflective material.

4. A light emitting device according to claim 1, wherein the light guide is bonded to the textile substrate by means of a transmissive bonding material.

5. A light emitting device according to claim 4, wherein the refractive index of the bonding material is higher than the refractive index of the surrounding atmosphere and lower that the refractive index of the light guide material.

6. A light emitting device according to claim 1, wherein the light guide comprises a flexible material.

7. A light emitting device according to claim 1, wherein the light emitting element (100) is optically bonded to the light receiving surface.

8. A light emitting device according to claim 1, wherein the light emitting element is incorporated in the light guide.

9. A light emitting device according to claim 1, wherein a reflective material is arranged between the light guide and the textile substrate.

10. A light emitting device according to claim 1, wherein the thickness of the light guide decreases with distance from the light receiving surface.

11. A light emitting device according to claim 1, wherein the light guide (201) comprises a light extracting structure for extracting light that is subject to total internal reflection in the light guide, from the light guide via at least one of the back surface and the front surface.

12. A method for the manufacture of a light emitting device according to claim 1, comprising the steps of
bonding a light guide and a light emitting element on a textile substrate by means of a transmissive bonding material, and
cutting the sides of the light guide into a predetermined shape.

13. A light emitting device comprising a light emitting element and a light guide arranged on a textile substrate, the light guide having a back surface facing the textile substrate, a front surface facing away from the textile substrate, and a light receiving surface, the light emitting element being arranged such that at least part of the light emitted by the light emitting element is coupled into the light guide through the light receiving surface, and is subject to total internal reflection in the light guide, and the light guide being arranged such that at least part of the light coupled into the light guide exits the light guide through at least one of the front surface and the back surface, wherein the thickness of the light guide decreases with distance from the light receiving surface.

14. A light emitting device comprising a light emitting element and a light guide arranged on a textile substrate, the light guide having a back surface facing the textile substrate, a front surface facing away from the textile substrate, and a light receiving surface, the light emitting element being arranged such that at least part of the light emitted by the light emitting element is coupled into the light guide through the light receiving surface, and is subject to total internal reflection in the light guide, and the light guide being arranged such that at least part of the light coupled into the light guide exits the light guide through at least one of the front surface and the back surface, wherein the thickness of the light guide decreases with distance from the light receiving surface, wherein the light guide comprises a light extracting structure for extracting light that is subject to total internal reflection in the light guide, from the light guide via at least one of the back surface and the front surface.

* * * * *